United States Patent [19]

Surber

[11] Patent Number: 5,114,830
[45] Date of Patent: May 19, 1992

[54] SOLDER MASK RESINS HAVING IMPROVED STABILITY CONTAINING A MULTIFUNCTIONAL EPOXIDE AND A PARTIAL ESTER OR STYRENE-MALEIC ANHYDRIDE COPOLYMER

[75] Inventor: Sherry L. Surber, Powder Springs, Ga.

[73] Assignee: W. R. Grace & Co.-Conn., New York, N.Y.

[21] Appl. No.: 264,223

[22] Filed: Oct. 28, 1988

[51] Int. Cl.⁵ ................................ G03C 1/72
[52] U.S. Cl. .................... 430/280; 430/325; 430/330; 430/311
[58] Field of Search ............ 430/280, 288, 330, 325, 430/311, 322; 522/120, 101

[56] References Cited

U.S. PATENT DOCUMENTS

| | | | |
|---|---|---|---|
| 3,717,557 | 2/1973 | Peterson et al. | 204/159.15 |
| 3,796,578 | 3/1974 | Hosoi et al. | 96/67 |
| 3,825,430 | 7/1974 | Kurka | 96/115 |
| 3,916,035 | 10/1975 | Brewer | 427/43 |
| 3,989,610 | 11/1976 | Tsukada et al. | 204/159.15 |
| 4,262,081 | 4/1981 | Bowden et al. | 430/280 |
| 4,346,163 | 8/1982 | Takeyama et al. | 430/280 |
| 4,370,403 | 1/1983 | Takaki | 430/271 |
| 4,401,793 | 8/1983 | Chiao et al. | 525/285 |
| 4,427,760 | 1/1984 | Nagazawa et al. | 430/287 |
| 4,438,189 | 3/1984 | Geissler et al. | 430/280 |
| 4,456,679 | 6/1984 | Leyrer et al. | 430/326 |
| 4,458,063 | 7/1984 | Kanno et al. | 430/280 |
| 4,476,215 | 10/1984 | Kausch | 430/281 |
| 4,485,166 | 11/1984 | Herwig et al. | 430/260 |
| 4,544,622 | 10/1985 | Kausch | 430/278 |
| 4,727,947 | 2/1988 | Thanawalla et al. | 522/120 |
| 4,745,138 | 5/1988 | Thanawalla et al. | 522/120 |

FOREIGN PATENT DOCUMENTS 0287019 10/1988 European Pat. Off. .
0287020 10/1988 European Pat. Off. .
63-11930 1/1988 Japan .

OTHER PUBLICATIONS

PCT Application No. WO 89/05476 published Jun. 15, 1989.

Primary Examiner—Marion E. McCamish
Assistant Examiner—Christopher D. RoDee
Attorney, Agent, or Firm—John J. Wasatonic; William L. Baker

[57] ABSTRACT

Photosensitive resin compositions which can be used to prepare solder masks of improved stability are provided, together with a method of forming a cured, imagewise distribution of the solder mask composition on a printed circuit board substrate.

12 Claims, No Drawings

SOLDER MASK RESINS HAVING IMPROVED STABILITY CONTAINING A MULTIFUNCTIONAL EPOXIDE AND A PARTIAL ESTER OR STYRENE-MALEIC ANHYDRIDE COPOLYMER

The present invention relates to photosensitive compositions which can be used to provide solder masks of improved stability and to a method of forming a cured, imagewise distribution of the solder mask composition.

The use of photopolymer compositions as solder masks in printed circuit production processes is well known. Generally, the solder mask is formed by depositing a photopolymer composition on the printed circuit board substrate, exposing the photopolymer in an imagewise manner to radiation to effect curing of the photopolymer, and removing the unexposed photopolymer to provide an imagewise pattern of cured photopolymer composition. With many such compositions, a post-baking step is carried out to achieve more complete curing. The cured photopolymer composition protects the underlying sections of the circuit board during the subsequent soldering operation, effectively preventing unwanted exposure of the board to the molten solder. After soldering is completed, the cured photopolymer composition is generally removed, usually by dissolution in a solvent.

It is highly desirable that the cured solder mask not degrade, blister, or separate from the circuit board substrate under the conditions of the soldering operation. The solder mask should thus have a high thermal resistance, chemical resistance to various solvents and to the fluxes used in soldering, and a high degree of hydrolytic stability, i.e., stability under high humidity conditions.

Solder masks having desirable properties can be prepared using resins containing partial esters of a hydroxyalkyl (meth)acrylate and a styrene-maleic anhydride copolymer and multifunctional (meth)acrylate monomers which can be reacted with the (meth)acrylate groups on the copolymer to effect cross-linking. This cross-linking reaction is effected in an imagewise manner by imagewise exposure of the composition to ultraviolet radiation in the presence of a photoinitiator. Partial curing of the polymer is thus effected and a differential solubility in certain developing agents, e.g., aqueous alkaline developing solutions, is achieved. Unexposed polymer may thus be removed by development with such agents, leaving an imagewise distribution of partially cured photopolymer composition on the circuit board substrate.

To obtain optimal properties in such cured photopolymer compositions for use as solder masks, the partially cured composition is subjected to a "post-baking" step in order to achieve thermal curing. In accordance with this invention, it has been determined that during the baking step a substantial percentage of the hydroxyalkyl (meth)acrylate groups become dissociated from the polymer, regenerating the maleic anhydride groups. The resultant decrease in cross-link density is highly detrimental to the thermal and chemical resistance of the solder mask, as well as its hydrolytic stability.

The present invention has as its principal object the provision of a composition and a method which overcome the above detrimental effects of post-baking. The present invention thus provides radiation curable compositions which comprise a partial ester of a hydroxyalkyl (meth)acrylate and a styrene-maleic anhydride copolymer, a multifunctional (meth)acrylate monomer, i.e., a monomer containing two or more reactive (meth)acrylate groups, capable of undergoing photoinitiated reaction with the (meth)acrylate groups on the copolymer to effect cross-linking, a photoinitiator, and a multifunctional epoxide, i.e., a compound containing two or more reactive epoxide groups. By "reactive epoxide groups" is meant epoxide groups capable of undergoing reaction with maleic anhydride groups on the copolymer at post-baking temperatures. In accordance with the method aspects of the invention, it has been found that the inventive compositions can be coated, exposed, developed, and post-baked similar to the conventional compositions (i.e., the corresponding compositions without the epoxide present), without encountering the undesirable effects of post-baking previously observed with the conventional compositions.

Thus, the multifunctional epoxide, being reactive with the maleic anhydride groups on the polymer generated by post-baking, functions to provide new and more stable cross-linking of the photopolymer. The method of the invention accordingly comprises the steps of coating a printed circuit board substrate with a radiation curable composition of the invention, exposing the coated composition imagewise to actinic radiation, preferably ultraviolet radiation, to effect imagewise curing of the composition, removing unexposed portions of the composition from the circuit board substrate, and baking the circuit board substrate bearing the imagewise distribution of cured photopolymer composition at temperatures of at least 100° C. to effect further curing of the composition, whereby the epoxide is caused to react with free anhydride groups on the copolymer generated as a result of dissociation of the hydroxyalkyl (meth)acrylate groups therefrom.

The partial ester copolymers used in this invention are prepared by reaction of styrene-maleic anhydride (SMA) copolymer with hydroxyalkyl (meth)acrylates in known manner. In general, the SMA copolymer has a number molecular weight in the range of about 500 to 4000 and a mole ratio of styrene to maleic anhydride of about 1:1 to 4:1. SMA copolymers which can be used in preparing the partial esters of the invention are commercially available under the tradename "SMA Resins" from ARCO Chemical Company.

The hydroxyalkyl (meth)acrylate reacted with the SMA copolymer can be, for example, hydroxyethyl acrylate, hydroxyethyl methacrylate, hydroxypropyl acrylate, hydroxybutyl methacrylate, tetrapropylene glycol monoacrylate, tetrapropylene glycol monomethacrylate, and the like.

The esterification reaction can be carried out using known procedures, such as those disclosed in U.S. Pat. No. 4,722,947. It is preferred that at least 50%, more preferably at least 75%, of the available anhydride groups of the copolymer are esterified.

The reactive multifunctional (meth)acrylate monomers of the compositions of the invention are well known and include polyol polyacrylates and polymethacrylates. Exemplary materials include 1,6-hexane diol diacrylate, neopentyl glycol diacrylate, trimethylol propane triacylate, ethoxylated trimethylolpropane triacrylate, 1,3-butylene glycol diacrylate, tetraethylene glycol diacrylate, and acrylate esters of bisphenol-A based epoxies. A mixture of multifunctional (meth)acrylate monomers may be used. The reactive multifunctional acrylates are chosen on the basis of their reactivity, their solvency for the esterified SMA copolymer component, and effect on viscosity.

The photoinitiator used in the compositions of the invention can be any radiation responsive free-radical generating compound known in the art for such purpose, such as the UV responsive photoinitiators 2,2-dimethoxy-2-phenyl acetophenone, 2-hydroxy-2-methyl-1-phenyl propan-1-one, benzoin, benzoin methyl ether, benzil, benzophenone, acetophenone, and 2-methyl -1- [4-(methyl thio)phenyl]-2-morpholinopropanone-1, and isopropylthioxanthone.

The multifunctional epoxides of the invention include any diepoxide, triepoxide, or epoxide of greater functionality capable of reacting with the regenerated anhydride groups of the copolymer. Epoxy novolac resins are preferred, e.g., the epoxy cresylic novolac resin sold by Shell Oil Company under the tradename EPON Resin DPS-164 and the epoxidized phenolic novolac resins of Ciba-Geigy sold under the "EPN" tradename. A mixture of multifuctional epoxides may be used. In a particularly preferred embodiment a combination of a solid epoxy resin, such as DPS-164 and a semi-solid epoxy resin, such as EPN 1138, is employed. Such a combination of resins has been found to provide an optimum combination of properties, particularly with regard to developability and obtention of a tack free surface on the photopolymer composition.

Other additive materials may be included in the compositions of the invention, such as flow promoting agents, air release agents, pigments and dyes, sensitizers, viscosity control agents, and monofunctional radiation polymerizable monomers.

In order to attain optimal stability prior to utilization, it is preferred to delay combination of the multifunctional epoxy component with the esterified SMA resin/multifunctional monomer combination until shortly before coating. Thus, it is preferred to prepare a two part system consisting of one composition of the esterified SMA copolymer, multifunctional monomer, photoinitiator, and desired additional additives and a second composition comprising the multifunctional epoxides and desired additional additives. The copolymer composition is generally provided as a liquid or as a solvent solution or solvent carried composition incorporating of an inert solvent. At least a portion of the solvent may be residual from the preparative esterification reaction. The epoxide composition is generally provided as a mixture of the respective epoxide components and an inert solvent. It is generally desirable to minimize the amount of inert solvent in the respective compositions.

The compositions of this invention coated onto the circuit board substrate will generally contain about 15% to about 40% by weight of the esterified copolymer resin, about 2% to 15% by weight of the multifunctional monomer, about 3% to 12% by weight of photoinitiator and about 10% to 35% by weight of multifunctional epoxy materials, based on the total weight of the composition, including other additives and solvents.

The compositions may be coated using conventional methods such as roll coating, curtain coating, and, preferably screen coating. After coating the composition, it is preferred to dry it at elevated temperatures, e.g., at temperatures in the range of 50° C. to 90° C., as necessary to remove any solvents. For the exposure step, the phototool is preferably brought into contact with the coated and dried photopolymer composition in order to provide optimum image resolution. However, off-contact exposure methods known in the art, e.g., using collimated radiation, may also be employed. The radiation used to cure the composition can be any high energy radiation such as electron beam radiation or, preferably, ultraviolet light. Removal of the unexposed photopolymer composition is generally by means of a developing agent solution, preferably an aqueous alkaline solution. A preferred developing agent is a dilute aqueous solution of sodium carbonate, e.g., 1% or 2% sodium carbonate solution. Development may be aided by brushing, spraying, and other such techniques well known in the art. A typical development process involves washing with a 1% sodium carbonate solution for about one minute at temperatures of about 32° C. to 50° C.

After development, the circuit board is usually subjected to post-exposure to actinic radiation to effect further free-radical curing of the photopolymer.

The post-baking step can be conducted in a convection oven or IR oven. The post-baking temperature is at least 100° C., and preferably is about 130° C. to 170° C. A typical post-baking procedure involves heating the board at about 150° C. in a convection oven for about one hour.

As indicated above, maleic anydride groups regenerated during the post-baking step react with the multifunctional epoxide component, effecting a re-crosslinking of the polymer, i.e., effectively re-establishing the cross-links destroyed upon regeneration of the maleic anhydride groups. It should be understood some degree of regeneration of the maleic anhydride groups may also occur during drying of the photopolymer after coating and that these regenerated groups will also be reacted with the epoxide during the post-baking procedure. The cross-links formed by reaction of the epoxide are more stable than the esterified cross-links of the original copolymer, such that the degree of degradation of the solder mask under soldering or testing conditions, and concomitant blistering or separation of the solder mask from the substrate is substantially reduced. In general, the epoxide cross-linked solder masks of this invention meet the performance requirements of the IPC 1983 Standard SM-840A, Class 3 requirements.

EXAMPLE

A first composition was prepared by mixing 25.4 parts by weight of a partial ester of hydroxyethyl (meth-)acrylate and a styrene-maleic anhydride coPolymer having a molecular weight of about 1600 (SMA Resin 1000 of Arco Chemical Co.), the partial ester being purchased from Sartomer Co., a subsidiary of Pony Industries Inc., New York, N.Y., and having a degree of esterification of about 75% to 85% of the available maleic-anhydride groups; 4.97 parts of an acid modified acrylate ester of bisphenol-A based epoxy (Novacure 3800, sold by Interez Inc., Louisville, Kentucky); 1.33 parts of a thioxanthone Photoinitiator; 7.37 parts of 2-methyl-1-[4-(methyl thio)phenyl]-2-morpholmopropanone-1 (Irgagure 907, sold by Ciba Geigy); 1.84 parts of ethoxylated trimethylol propane triacrylate; 0.92 parts of a flow promoting agent; 0.92 parts of an air release agent; 13.8 parts of talc; 2.00 parts of trimethylolpropane triacrylate, and 6.44 parts of ethylene glycol monobutyl ether acetate (Glycol Ether EB Acetate, sold by Ashland Chemical Co.)

A second composition was prepared containing 14.89 parts of an epoxy cresylic novolac resin (Epon Resin DPS 164, sold by Shell Oil Co.); 7.35 parts of an epoxidized phenol novolac resin having an average functionality of 3.6 (Araldite EPN 1138, sold by Ciba-Geigy);

9.10 parts of Glycol Ether EB Acetate, and 3.66 parts of fumed silica (Cabosil M-5).

The above compositions were mixed at room temperature and screen printed onto printed circuit board using a 70 durometer rounded edge squeegee. The laydown was about 2.5 mils dry. The coating was dried at 80° C. for about 25 minutes, the board cooled, and then coated on the other side and dried in an identical manner. A negative was then brought into contact with the respective coatings and each coating was subjected to about 400 to 600 millijoules of ultraviolet radiation. The coatings were developed by washing with a 1% sodium carbonate aqueous solution at 105° F. to 110° F. for about 1 minute. The resultant imagewise distribution of cured photopolymer composition was given a post exposure of 2-4 joules and then baked in a convection oven at 150° C. for one hour. The resultant solder mask coating met the requirements of IPC 1983 Standard SM-840A, Class 3.

What is claimed is:

1. A radiation curable composition comprising a partial ester of a hydroxyalky (meth)acrylate and a styrene-maleic anhydride copolymer, a multifunctional (meth)acrylate monomer, a photoinitiator, and a multifunctional epoxide.

2. A composition of claim 1 wherein said hydroxyalkyl (meth)acrylate is hydroxyethyl (meth acrylate.

3. A composition of claim 1 comprising a mixture of multifunctional (meth)acrylate monomers.

4. A composition of claim 1 further comprising an inert solvent.

5. A composition of claim 1 wherein said multifunctional epoxide is an epoxidized novolac resin.

6. A composition of claim 1 comprising a mixture of multifunctional epoxides.

7. A method of preparing a cured solder mask comprising the steps of coating a printed circuit board with a radiation curable photopolymer composition comprising a partial ester of a hydroxyalky (meth)arcylate and a styrene-maleic anhydride copolymer, a multifunctional (meth)acrylate monomer, a photoinitiator, and a multifunctional epoxide; exposing the coated radiation curable photopolymer composition imagewise to actinic radiation to effect imagewise curing and cross-linking of said composition; removing unexposed photopolymer from said printed circuit board; baking the printed circuit board bearing the cured photopolymer composition at a temperature of at least 100° C. to effect further curing of the composition, whereby free anhydride groups are generated on said copolymer as a result of dissociation of hydroxyalky (meth)acrylate groups therfrom, thereby decreasing the cross-link density in said composition; and reacting said epoxide with said anhydride groups to provide new cross-linking of said composition.

8. A method of claim 7 further comprising drying the coated photopolymer composition prior to exposure.

9. A method of claim 7 further comprising post-exposing the photopolymer composition to actinic radiation prior to baking.

10. A method of 7 wherein said Printed circuit board is baked at a temperature of about 130° C. to 170° C.

11. A method of claim 7 wherein said unexposed photopolymer composition is removed by washing with a developing agent.

12. A method of claim 11 wherein said developing agent is an aqueous alkaline solution.

* * * * *